United States Patent [19]

Fueki et al.

[11] Patent Number: 5,448,075
[45] Date of Patent: Sep. 5, 1995

[54] ELECTRON-BEAM EXPOSURE SYSTEM HAVING AN IMPROVED RATE OF EXPOSURE THROUGHPUT

[75] Inventors: Shunsuke Fueki; Hiroshi Yasuda, both of Kawasaki, Japan

[73] Assignee: Fujitsu Limited, Kawasaki, Japan

[21] Appl. No.: 241,409

[22] Filed: May 11, 1994

[30] Foreign Application Priority Data

Jun. 25, 1993 [JP] Japan .................................. 5-155726

[51] Int. Cl.⁶ ........................................... H01J 37/302
[52] U.S. Cl. ................................. 250/492.22; 250/398
[58] Field of Search ................... 250/492.22, 398

[56] References Cited

U.S. PATENT DOCUMENTS 5,369,282 11/1994 Arai et al. ..................... 250/492.22

Primary Examiner—Davis L. Willis
Assistant Examiner—Kiet T. Nguyen
Attorney, Agent, or Firm—Armstrong, Westerman, Hattori, McLeland and Naughton

[57] ABSTRACT

An electron beam exposure system includes a pattern memory for storing bitmap data of a pattern to be exposed, wherein the pattern memory includes a number of latch elements arranged in rows and columns such that the writing of the bitmap data is achieved line by line and such that the reading of the bitmap data is achieved column by column.

10 Claims, 13 Drawing Sheets

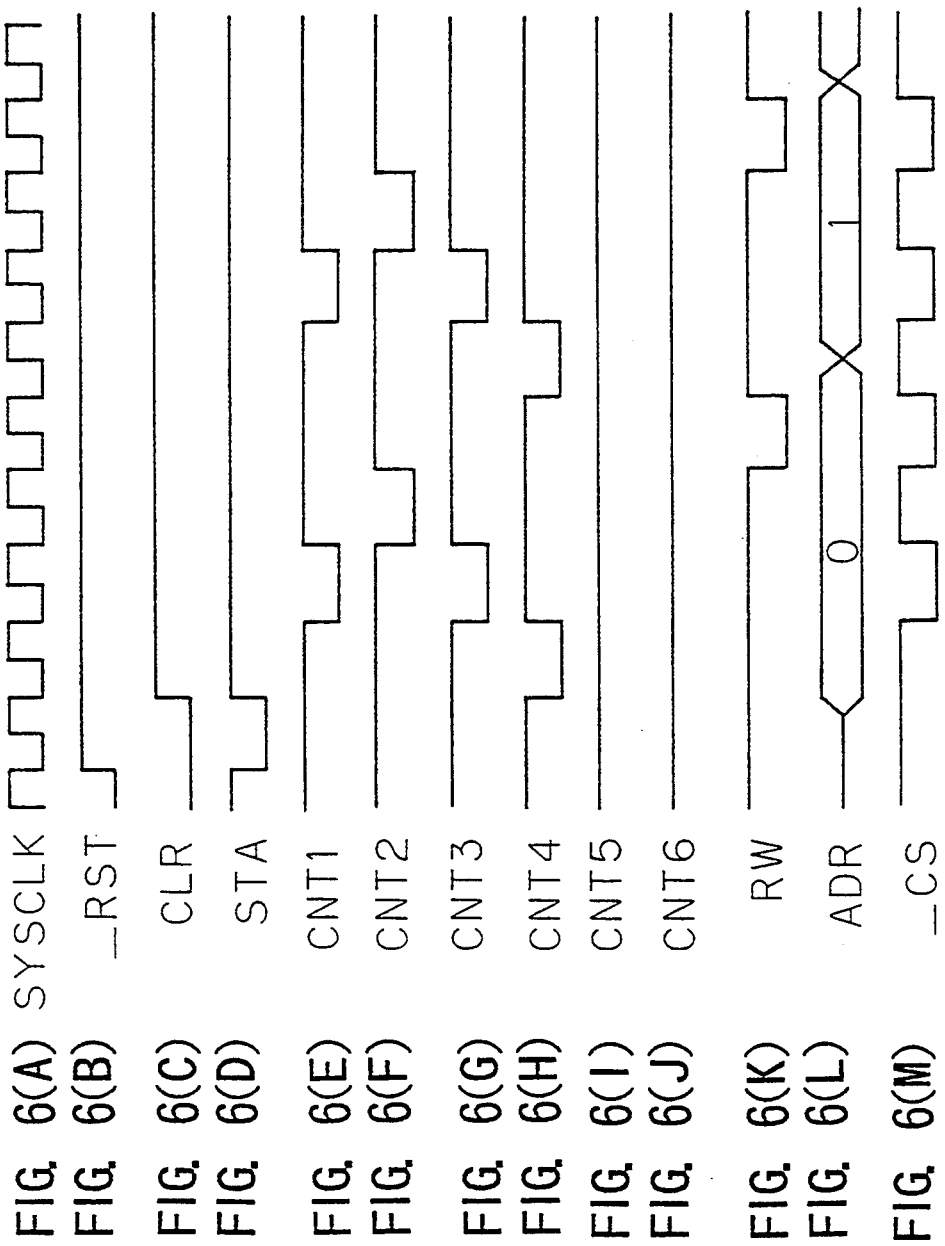

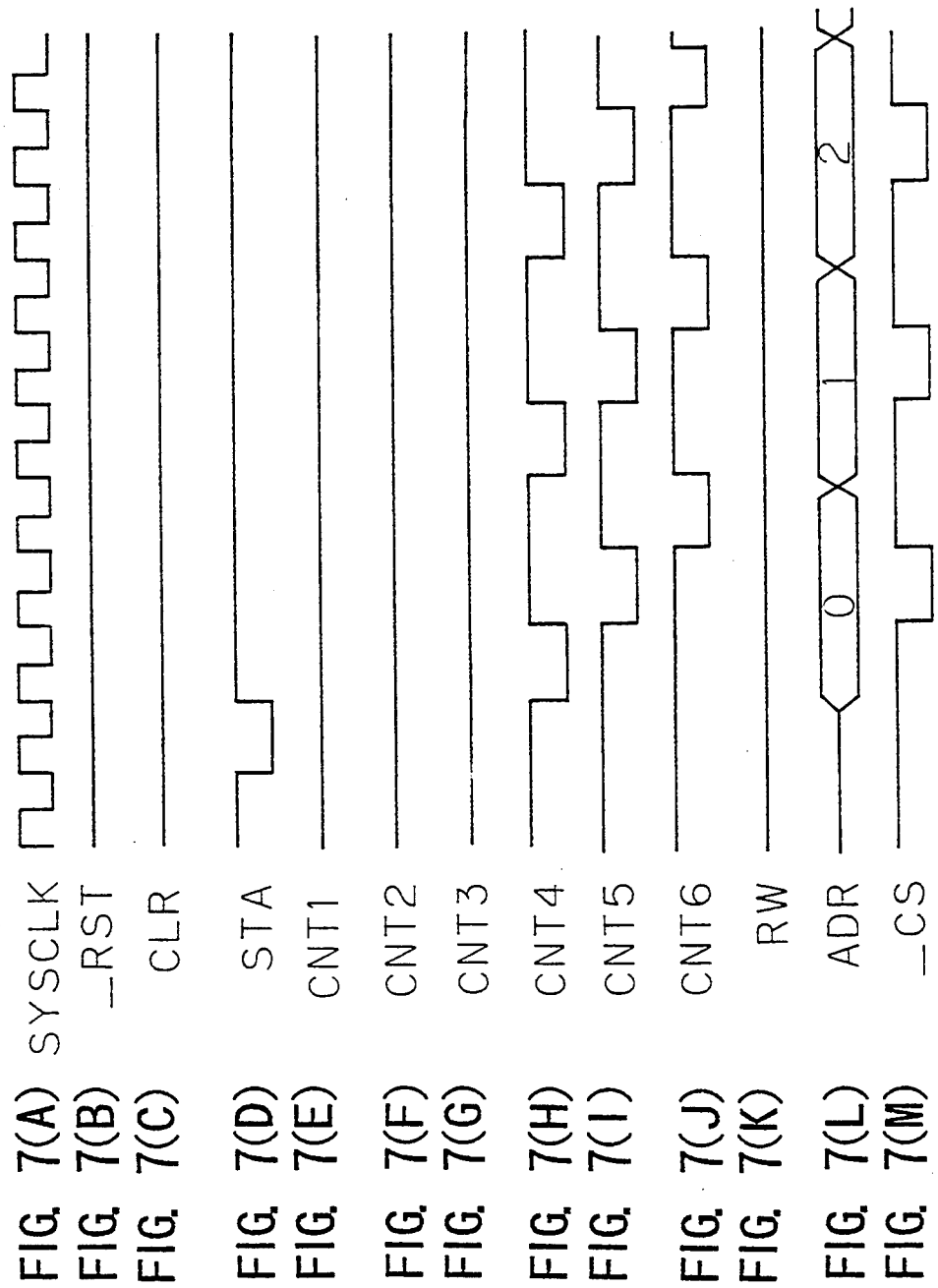

ELECTRON-BEAM EXPOSURE SYSTEM HAVING AN IMPROVED RATE OF EXPOSURE THROUGHPUT

BACKGROUND OF THE INVENTION

The present invention relates in general to the production of semiconductor devices, particularly to an electron-beam exposure process and system capable of exposing versatile patterns of semiconductor devices on an object such as a semiconductor substrate by means of a charged particle beam such as an electron beam.

Electron-beam lithography is an essential technique for fabricating advanced semiconductor integrated circuits having a large integration density. By using electron-beam lithography, it is possible to expose a pattern having a width of 0.05 μm or less with an alignment error of 0.02 μm or less. Therefore, it is generally considered that the electron-beam lithography will play a central role in the production of future semiconductor devices such as a DRAM (dynamic random access memory) having a large memory capacity which exceeds 256M bits or 1G bits, or very powerful high-speed microprocessors.

In the production of such advanced semiconductor devices, not only the resolution of device patterns but also the throughput at the time of exposure are of the essential importance. Since the electron-beam lithography exposes patterns by a single focused electron beam, it has a disadvantage in this regard as compared to the conventional optical exposure process which can expose all patterns in a single shot. The conventional optical exposure method, however, is reaching its limit of resolution, and therefore there are circumstances in which it is necessary to rely upon the electron-beam exposure process in the future production of high-speed/high-functional semiconductor devices.

In such situations, there are various proposals to improve the throughput of the electron-beam exposure process. For example, the applicant of the present invention proposed a so-called block exposure process. In the block exposure process, a device pattern is decomposed into a number of fundamental patterns, and the electron beam is shaped according to these fundamental patterns. The block exposure process is especially suitable for the exposure of a semiconductor memory in which a relatively small number of fundamental patterns are repeated, and has successfully achieved a throughput of 1 cm²/second at present.

On the other hand, the block exposure process has a problem in that, in the semiconductor devices that contain complex and diversified logic circuits such as a microprocessor, the exposure efficiency is deteriorated. This is because the patterns which can be formed by the block exposure process are limited to the combination of a small number of basic, fundamental patterns. If an attempt is made to form irregular exposure patterns by the block exposure method, it is required to form a so-called variable shaped beam by activating electrostatic or electromagnetic deflectors. However, such a variable-beam shaping has a problem in that the exposure efficiency is deteriorated because of the setting time, operational speed and the like, of the deflectors.

In order to achieve the exposure of semiconductor devices containing such complex and diversified logic circuits with high throughput, there has been proposed an electron-beam exposure system having a so-called blanking aperture array (BAA) in which an exposure pattern is represented in the form of a dot pattern that contains small exposure dots. In the BAA, the electron beam that forms each dot is turned on and off depending on to the desired exposure pattern.

FIG. 1 shows a schematic view of a conventional electron-beam exposure system using a blanking aperture array. Referring to FIG. 1, the electron-beam exposure system comprises generally an electron optical system 100 that produces a focused electron beam and a control system 200 for controlling the electron optical system 100. The electron optical system 100 includes an electron gun 101 as an electron beam source, and the electron gun 101 emits the electron beam as a divergent electron beam along a predetermined optical axis O.

The electron beam thus produced by the electron gun 101 is shaped by an aperture 102a provided on an aperture plate 102, wherein the aperture 102a shapes the electron beam upon passage therethrough. The aperture 102a is in alignment with the optical axis O, and shapes the incident electron beam to have a rectangular cross section.

The shaped electron beam thus formed is focused on a BAA mask 110 by an electron lens 103, wherein the BAA mask carries thereon a blanking aperture array. Thus, the electron lens 103 projects the image of the aforementioned rectangular aperture 102a on the BAA mask 110. On the BAA mask 110, there are formed a plurality of small apertures corresponding to the exposure dots to be exposed on a semiconductor substrate, and an electrostatic deflector is provided on the BAA mask 110 in correspondence to each of the apertures. The electrostatic deflector is controlled by a driving signal E to pass the electron beam directly in a non-activated state, or to deflect the passing electron beam in an activated state, so that the direction of the passing electron beam deviates from the optical axis O. As a result, as described below, an exposure dot pattern corresponding to the non-activated apertures on the BAA mask 110 is formed on the semiconductor substrate.

The electron beam passed through the BAA mask 110 is focused at a focal point $f_1$ on the optical axis O after passing through the electron lenses 104 and 105 that form a demagnifying optical system, and the image of the selected apertures is projected at the focal point $f_1$. The focused electron beam is further focused on a semiconductor substrate 115 held on a movable stage 114 by electron lenses 106 and 107 that form another demagnifying optical system, after passing through a round aperture 113a provided on a round aperture plate 113. Thus, an image of the BAA mask 110 is projected on the substrate 115. Here, the electron lens 107 acts as an objective lens and includes therein various correction coils 108 and 109 for correcting focal point and aberrations as well as deflectors 111 and 112 for moving the focused electron beam over the surface of the substrate 115.

Further, there is provided an electrostatic deflector 116 between the lens 104 and lens 105, wherein the path of the electron beam is deviated from the optical axis O, which is set to pass through the round aperture 113a on the plate 113, upon activation of the electrostatic deflector 116. As a result, it becomes possible to switch the electron beam on/off at a high speed on the semiconductor substrate 115. Furthermore, the electron beams, which have been deflected by the electrostatic deflectors on the apertures on the BAA mask 110 described above, deviate also from the round aperture 113a.

Therefore, the electron beams thus deflected do not reach the semiconductor substrate and it becomes possible to control the exposure dot pattern on the substrate 115.

The electron-beam exposure system of FIG. 1 uses a control system 200 for controlling such exposure operations. The control system 200 includes an external storage device 201, such as a magnetic disk device or a magnetic tape device for storing data relating to the patterns of the semiconductor device to be exposed.

The data stored in the storage device 201 is read out by a CPU 202, and the data compression thereof is removed by a data expansion circuit 203. Thereby, the data is converted to the exposure dot data which switches the individual apertures on the BAA mask 110 on/off according to the desired exposure pattern. As described later with reference to FIG. 2, the electron-beam exposure system of FIG. 1 achieves a delicate correction of the exposure pattern by conducting a multiple exposure of exposure dots on the substrate 115, wherein N independent exposure patterns are superposed. Accordingly, the data expansion circuit 203 includes N parts comprising circuits $203_1$ to $203_N$, and the circuits $203_1$ to $203_N$ generate N sets of mutually independent exposure dot pattern data used for carrying out the foregoing multiple exposures superposed N times, based upon the exposure data provided from CPU 202.

Each of the circuits $203_1$ to $203_N$ is composed of a buffer memory 203a for holding exposure data supplied from said CPU 202, a data expansion section 203b which generates the dot pattern data representing the exposure dot pattern based upon the exposure data held in the buffer memory 203a, and a canvas memory 203c for holding the dot pattern data expanded by the data expansion section 203b, wherein the data expansion circuit 203 supplies the dot pattern data held in the canvas memory 203c to a corresponding output buffer circuit 204. More specifically, the output buffer circuit 204 includes N holding circuits $204^1$ to $204^N$ corresponding to the N data expansion circuits $203_1$ to $203_N$, and each of the holding circuits, e.g., the circuit $204^1$ includes 128 circuits, circuits $204_1$ to $204_{128}$, in correspondence to the total of 128 apertures aligned in the X direction on the BAA mask 110. Thus, each of the circuits $204_1$ to $204_{128}$ is supplied with and holds therein one-bit data that switches the aperture on the BAA mask 110 on/off, from said canvas memory 203c. The circuits $204^1$ to $204^N$, in turn supply the one-bit data held therein to the BAA mask 110 after converting the same into analog signals by means of corresponding D/A converters $205_1$ to $205_N$. As a result, the electrostatic deflectors aligned in the Y direction on said BAA mask 110 in correspondence to the apertures are activated sequentially.

Furthermore, the electron-beam exposure system of FIG. 1 includes an exposure control unit 206 which is supplied with a control signal from the CPU 202 based upon the control program stored in the external storage device 201, wherein the exposure control unit 206 controls the operation of the data expansion circuit 203 and the output buffer circuit 204, the transfer of data from the data expansion circuit 203 to the buffer circuit 204, and the activation of the BAA mask 110 by means of the D/A converter 205. Furthermore, the exposure control unit 206 controls the main deflector 111 and the sub deflector 112 via a main deflector control circuit 207 and a sub deflector circuit 208, such that the electron beam scans over the surface of the substrate 115. The main deflector control circuit 207 includes a distortion-correction circuit 207a for correcting aberration by driving a correction coil 109 via an astigmatic correction circuit 207b. Furthermore, the correction circuit 207a carries out the focusing correction by driving a focusing correction coil 108 via a focusing correction circuit 207c.

Furthermore, there is provided a refocus control circuit 203e in the exposure system of FIG. 1 in order to correct the dispersion of the electron beam due to the Coulomb repulsion caused at the time of focusing the electron beam. Thus, the refocus control circuit 203e adjusts properly the strength of the electron lens 106 corresponding to the exposure dot pattern.

Now, the structure of the BAA mask 110 will be briefly described with reference to FIG. 2.

Referring to FIG. 2, the BAA mask 110 carries thereon a plurality of aperture rows $A_1$, $A_2$, $B_1$, $B_2$ . . . each including 128 apertures aligned in the X direction, wherein two aperture rows that are shifted mutually by one pitch in the X and Y directions, such as the aperture rows $A_1$ and $A_2$, the aperture rows $B_1$ and $B_2$ . . . , form respective aperture groups A, B, C and D. In the illustrated example, each of the aperture groups includes only a single aperture in the Y direction (column direction), while it should be noted that these aperture groups may include a plurality of apertures aligned in the Y direction in the actual BAA mask 110. In a typical embodiment, a total of 1024 apertures are aligned in the Y direction in the aperture rows $A_1$, $B_1$, $C_1$ and $D_1$ or in the aperture rows $A_2$, $B_2$, $C_2$ and $D_2$. As the result, the BAA mask 110 forms an electron beam bundle formed of a plurality of electron beam elements aligned in rows and columns in correspondence to each of the aperture groups, and each of the electron beam elements exposes an exposure dot having typically a size of 0.05 $\mu m \times 0.05$ $\mu m$ on the substrate 115. Thereby, exposure dots forming an array of $1024 \times 128$ at maximum are exposed simultaneously on the substrate 115.

The electron beam elements constituting the electron beam bundle are deflected in the Y direction of the drawing by the deflectors 111 and 112, wherein exposure dots corresponding to the aperture groups A–D are exposed on the substrate 115 repeatedly 1024 times in the maximum, in each of the locations on the substrate 115. More specifically, a row of exposure dots corresponding to the aperture row $B_1$ is exposed over a row of exposure dots that have already been exposed on the substrate 115 in correspondence to the aperture row $A_1$. Further, rows of the exposure dots corresponding to the aperture rows $C_1$ and $D_1$ are exposed in sequence thereon. A similar process is carried out with regard to the exposure of the aperture rows $A_2$, $B_2$, $C_2$ and $D_2$. Thus, after a row of exposure dots corresponding to the aperture row $A_2$ is exposed, rows of exposure dots corresponding to the aperture rows $B_2$, $C_2$ and $D_2$ are exposed thereon in sequence. Here, it should be noted that the exposure dots according to the aperture row $A_1$ and the exposure dots according to the aperture row $A_2$ interpolate each other to form a single dot row aligned in the X direction on the substrate 115. By shifting the apertures forming an aperture row by one pitch alternately between adjacent aperture rows in each of the aperture groups, it becomes possible to minimize the Coulomb interactions caused when the electron beam elements, shaped by the BAA mask 110, get too close to each other. If such Coulomb interactions are caused, as described above, the electron beam elements repel reciprocally to make the effective focal length of the electron lens too long.

In the BAA mask 110 of FIG. 2, it should be noted that the aperture rows in the aperture group A and the corresponding aperture rows in the adjacent aperture group B, such as the apertures forming the aperture row $A_1$ and the apertures forming the aperture row $B_1$, are shifted by $\frac{1}{4}$ pitch in the X and Y directions. Similar relationships hold with regard to the aperture rows $A_2$ and $B_2$, $B_1$ and $C_1$, and $B_2$ and $C_2$. Generally, in the exposure mask that carries thereon N aperture groups, the apertures forming aperture rows in a first aperture group and the apertures forming corresponding aperture rows in an adjacent aperture group, are shifted with each other by M/N pitch (M<N) in the X and Y direction, M being an optional integer smaller than N.

In the simplest case of the exposure using a BAA mask having such an M/N pitch shift structure, the identical exposure data is sent in sequence to the aperture rows $A_1$, $B_1$, $C_1$ and $D_1$ or to the aperture rows $A_2$, $B_2$, $C_2$ and $D_2$ to expose the dots in a desired dose of exposure so that the exposure of the desired exposure pattern is carried out. In such a BAA mask 110, it is further possible to carry out a very delicate correction of the exposure pattern by changing the exposure data depending upon each of the aperture groups. Therefore, the BAA mask 110 shown in FIG. 2 is extremely useful to correct the so-called proximity effect which causes excessive exposure, due to the electron beam being reflected or scattered on the substrate. By using the BAA mask 110 of FIG. 2, it is possible to cause the electron beam elements to scan in said Y direction simultaneously at different positions in the Y direction on the substrate 115 in correspondence to each row of the apertures $A_1$ to $D_2$, whereby efficient correction of the proximity effect can be achieved.

FIG. 3 shows an example of the exposure patterns provided from the CPU 202 to the buffer memory of the data expansion section 203 such as the buffer memory 203a. Referring to FIG. 3, white circles represent the exposure dots to be formed on the substrate 115, and a set of white circles represent an exposure pattern P. In the drawing, the exposure pattern P is divided into plural cell stripes extending in the vertical direction corresponding to the Y direction of FIG. 2, while each cell stripe is formed by bit lines extending in the horizontal direction that corresponds to the X direction. Further, each of the bit lines includes 128 exposure dots aligned in the horizontal direction. Typically, the cell stripe has a size of about 100 μm in the longitudinal direction and about 10 μm in the transverse direction.

FIG. 4 is a diagram showing the structure of the data expansion section by taking an example of the data processing unit $203_1$.

Referring to FIG. 4, the exposure data provided from the external storage device 201 includes shape data OP for specifying the pattern shape, starting point data $X_0$, $Y_0$ for specifying the origin in X and Y directions, first size data $X_1$ for specifying the size of the pattern in the X direction, and second size data $Y_1$ for specifying the size of the pattern in the Y direction. The shape data OP is supplied directly from the CPU 202 to a control circuit 217 provided in the expansion section and further to a block pattern library 219 therein, while the starting point data $Y_0$ is supplied to an address counter 203d also in the data expansion section. On the other hand, the starting point data $X_0$ is provided to a bitmap data shifter 212, and data $X_1$ is provided to the block pattern library 219. Thereby, the block pattern library 219 stores therein bitmap data corresponding to the data OP and $X_1$ supplied thereto.

The bitmap data thus formed is then read out from the block pattern library 219 and is held in a register 211. Further, the bitmap data is supplied to the bitmap data shifter 212 wherein the origin of the pattern data is shifted based upon the starting point data $X_0$. The bitmap data thus formed for one line is held in the X register 213.

Next, the bitmap data held in the X register 213 is supplied to an adder 214 and a subtracter 215, wherein the bitmap data is added to or subtracted from the bitmap data of the corresponding bit line forming the bitmap data of the exposure pattern that is already written in the canvas memory 203c. As a result, exposure dots are added or subtracted to/from the exposure pattern bitmap which has already been accumulated in the canvas memory 203c. Which one of the adder 214 or the subtracter 215 is to be used is controlled by the control circuit 217 in the data expansion section 203 based upon the shape data OP. Furthermore, according to the shape data OP, there may be the case that neither addition nor subtraction is carried out. After thus processed, the bitmap data for one bit line is supplied to an OR circuit 216 and is transferred to a temporary register 218, wherein the temporary register holds the bitmap data ready for writing into the canvas memory 203c. Further, the data in the temporary register is written into the canvas memory 203c in correspondence to the address that is specified by the address counter 203d. This address is increased with respect to the starting data $Y_0$ described already. It should be noted that the control circuit 217 is controlled by the exposure control unit 206 of FIG. 1 and controls the canvas memory 203c, the temporary register 218, the adder 214 and the subtracter 215, based upon the shape data OP.

In the electron-beam exposure system of FIG. 1, the apertures on the BAA mask 110 shown in FIG. 2 are addressed consecutively in the Y direction, as described above. Therefore, when the dot pattern data is read out from the canvas memory 203c in the data expansion circuit 203, it is required to carry out the reading for each of the columns that are aligned in the Y direction. Here, it should be noted that the conventional canvas memory 203c uses generally a high-speed memory such as SRAM (static random access memory). In such a construction, the writing of data is achieved by specifying the Y address by the address counter 203d as shown in FIG. 4, and the data held in the temporary register 218 is written into the canvas memory 203c one line by one line with a high writing speed. It should be noted that the data for one line corresponds to one row in FIG. 2 and is written in a single writing step. In the case of reading out the dot pattern data from the canvas memory, it is also necessary to carry out the reading one line by one line by specifying Y address consecutively. In such a reading process, therefore, it is necessary to rearrange the line-by-line dot pattern data that has been read out from the canvas memory 203c into column-by-column data corresponding to the columns of exposure dots, in order to drive the BAA mask shown in FIG. 2 in correspondence to the scanning of the electron beam.

Furthermore, in such a conventional construction of the data expansion circuit 203 wherein the conventional memory is used as the canvas memory 203c, the read out operation becomes inevitably slow due to the line-by-line reading of the data that is carried out by changing the Y-address consecutively. Particularly, in the electron-beam exposure system which carries out the exposure at a high speed with a clock rate of 400 MHz or more, there is a possibility that the reading of the dot pattern from the memory becomes a bottleneck of the exposure.

SUMMARY OF THE INVENTION

Accordingly, it a general object of the present invention to provide a novel and useful electron-beam exposure system which solves the foregoing problems.

Another and more specific object of the present invention is to provide an electron-beam exposure system for exposing a pattern on an object as a set of exposure dots, wherein the electron-beam exposure system is provided with a data expansion circuit that can read out a series of exposure dot pattern data in correspondence to the scanning of the electron beam, from an exposure pattern memory in which the exposure dot pattern is stored.

Another object of the present invention is to provide an electron-beam exposure system provided with an exposure pattern memory in which exposure dot pattern data is stored, for exposing the pattern on an object as a set of exposure dots based upon the exposure dot pattern data in said exposure pattern memory, wherein said exposure pattern memory has such a structure that a series of exposure dot patterns can be read out at an extremely high speed in correspondence to the scanning of the electron beam.

Another object of the present invention is to provide an electron-beam exposure system, comprising:

an electron beam source for producing and emitting an electron beam along a predetermined optical axis toward an object to be exposed;

focusing means for focusing said electron beam on said object to be exposed;

deflection means for deflecting said electron beam with respect to said optical axis for causing said electron beam to scan over said object to be exposed;

a blanking aperture array mask for forming a plurality of electron beam elements corresponding to individual exposure dots that constitute an exposure pattern, said blanking aperture array mask being provided on said optical axis between said electron beam source and said object to be exposed and carrying thereon a plurality of apertures arranged in rows and columns, said plurality of apertures forming said plurality of electron beam elements by shaping said electron beam;

driving means provided in correspondence to each of said plurality of apertures on said blanking aperture mask, said driving means being supplied with a driving signal for switching on and switching off the electron beam passing through said aperture in response to said driving signal;

data expansion means supplied with exposure data corresponding to said exposure pattern for generating dot pattern data representing the exposure dots to be exposed on said object based upon said exposure data;

pattern memory means for storing dot pattern data generated by said data expansion means;

write/read control means for writing said dot pattern data generated by said data expansion means into said pattern memory means and reading said dot pattern data from said pattern memory means; and exposure control means for controlling an exposure operation;

said pattern memory means comprising a plurality of memory cells arranged in rows and columns;

said write/read control means comprising:

a write/read section for writing dot pattern data line by line in sequence and further for reading out dot pattern data line by line in sequence;

a register section for storing said dot pattern data corresponding to one line and read out by said write/read section in the form of multiple bit data;

bit-selection means for selecting a bit from said multiple bit data stored in said register section; and a shift register including a plurality of cells, said shift register being supplied with the bits selected by said bit selection means in sequence in response to a reading out from said memory cell array, for storing said bits consecutively in said plurality of cells, said shift register driving each of apertures for one column formed on said BAA mask according to an output signal from said plurality of cells.

Another object of the present invention is to provide an electron-beam exposure system comprising:

an electron beam source for producing and emitting an electron beam along a predetermined optical axis toward an object to be exposed;

focusing means for focusing said electron beam on said object to be exposed;

deflection means for deflecting said electron beam with respect to said optical axis for causing said electron beam to scan over said object to be exposed;

a blanking aperture array mask for forming a plurality of electron beam elements corresponding to individual exposure dots that constitute an exposure pattern, said blanking aperture array mask being provided on said optical axis between said electron beam source and said object to be exposed and carrying thereon a plurality of apertures arranged in rows and columns, said plurality of apertures forming said plurality of electron beam elements by shaping said electron beam;

driving means provided in correspondence to each of said plurality of apertures on said blanking aperture mask, said driving means being supplied with a driving signal for turning on and turning off the electron beam passing through said aperture in response to said driving signal;

data expansion means supplied with exposure data corresponding to said exposure pattern for generating dot pattern data representing the exposure dots to be exposed on said object based upon said exposure data;

pattern memory means for storing dot pattern data generated by said data expansion means;

write/read control means for writing said dot pattern data generated by said data expansion means into said pattern memory means and reading said dot pattern data from said pattern memory means; and exposure control means for controlling an exposure operation;

said pattern memory means comprising:

a plurality of latch elements formed in rows and columns in correspondence to said plurality of apertures formed in rows and columns on said blanking aperture array mask; and output gate means provided in correspondence to each column of said plurality of latch elements;

each of said latch elements that form a row being supplied with one-bit data which constitutes dot pattern data for one line from said data expansion means, each of said latch elements that form a row being further supplied with a common line-selection signal and holding one-bit data supplied from said data expansion means in response to said line-selection signal;

said output gate means being supplied with a column selection signal for selecting a column, said output gate means outputting said dot patterns held in each of said latch elements simultaneously for each of said columns;

said write/read control means being controlled by said exposure control means for producing said line-selection signal and said column-selection signal.

According to a first aspect of the present invention as described above, it becomes possible to form in sequence the dot pattern data aligned in the column direction suitable for exposure by means of a BAA mask, based upon the dot pattern data read out line by line from the pattern memory. As a result, it becomes possible to change delicately the exposure pattern exposed on the object, by changing the exposure pattern in sequence with the scanning of the electron beam, such that a multiple exposure is achieved with different exposure patterns.

According to a second aspect of the present invention, because of the use of the latch array for the pattern memory wherein a free selection of the addresses is possible both with respect to the rows and columns, in place of the conventional memories such as SRAMs, DRAMs and the like, wherein the address has to be selected on the line-by-line basis, it is possible to carry out the writing of the dot pattern data into the canvas memory line-by-line according to the line-selection signal and carry out the reading of the dot pattern data from the memory column-by-column, in response to the column-selection signal. The line-selection signal may be given in the form of a write clock, and the selection of a line is carried out in the write/read control means, based upon the data indicative of the column address that represents the address of the dot data pattern in the Y direction. On the other hand, when the dot pattern data is to be read out, a latch circuit for one column is selected by said output gate means in response to the column-selection signal, resulting in a simultaneous output of the dot pattern data for one column. As the column direction of the latch array corresponds to the column direction of the BAA array and hence to the scanning direction of the electron beam at the time of exposure, it is possible to change the exposure pattern in sequence in correspondence to the scanning of the electron beam, by reading out the dot pattern data in the column direction and switching each aperture on the BAA mask on/off using said dot pattern data. Since the reading out of the dot pattern is carried out instantaneously, it is not necessary to read out the dot pattern from the pattern memory while changing the line address sequentially and to rearrange the read-out dot pattern data, contrary to the conventional system. As a result, even if the exposure is carried out at a very high speed, for example, at a clock rate of about 400 MHz, the problem of reading out of the data not following the exposure does not occur.

BRIEF DESCRIPTION OF THE DRAWINGS

FIGS. 6(A)–6(M) are timing charts showing the operation of the control system of FIG. 5 in a first mode:

FIGS. 7(A)–7(M) are timing charts showing the operation of the control device of FIG. 5 in another mode;

DETAILED DESCRIPTION OF PREFERRED EMBODIMENTS

Now, a first embodiment of the present invention will be described in detail with reference to FIG. 5. It should be noted that the present embodiment relates to the structure of a rearranging circuit for rearranging the data read out from the canvas memory 203c in the electron-beam exposure system of FIG. 1.

Figure 4:
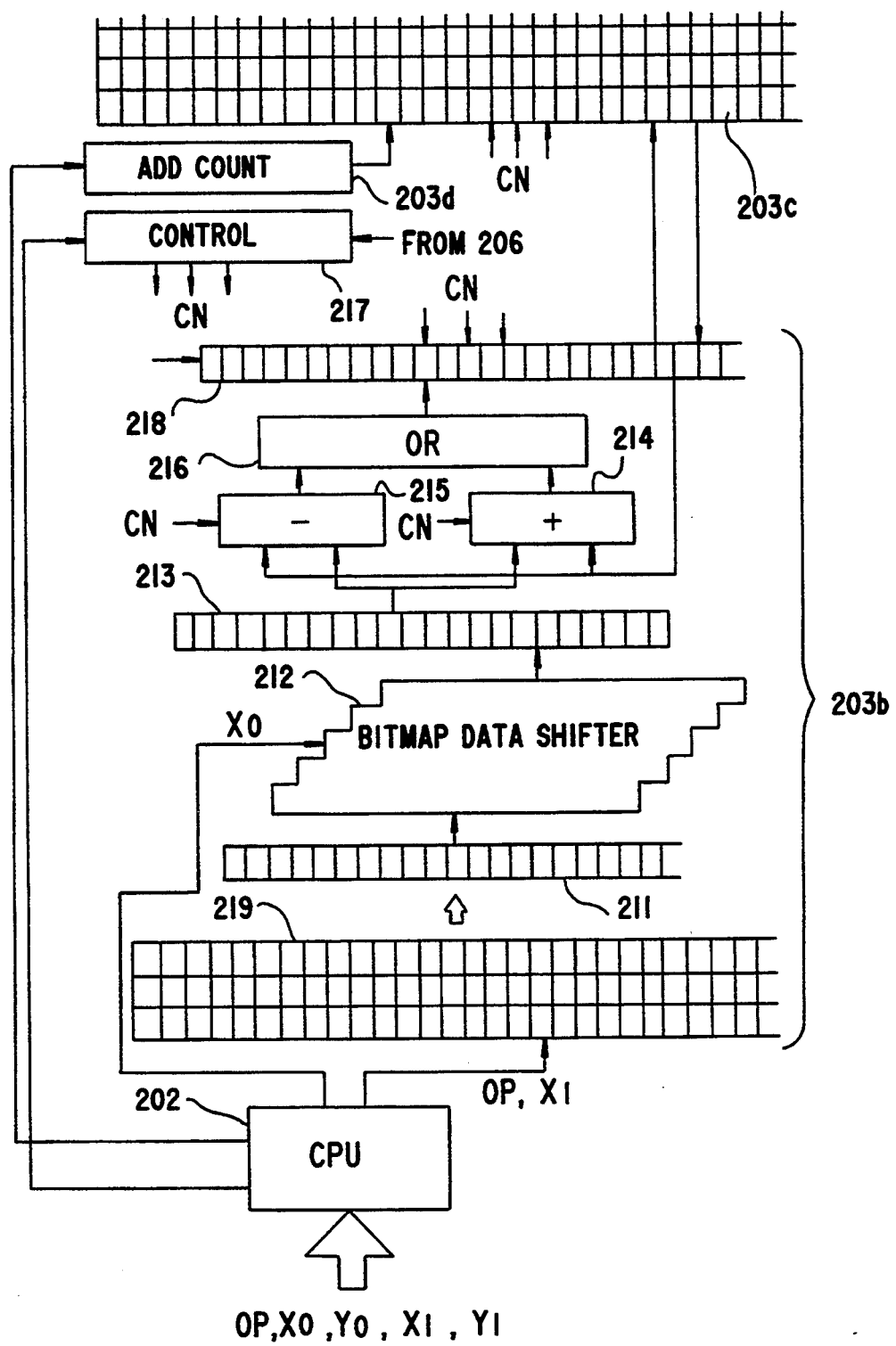
FIG. 4 is a diagram showing the construction of a data expansion circuit used in the electron-beam exposure system of FIG. 1.
Figure 5:
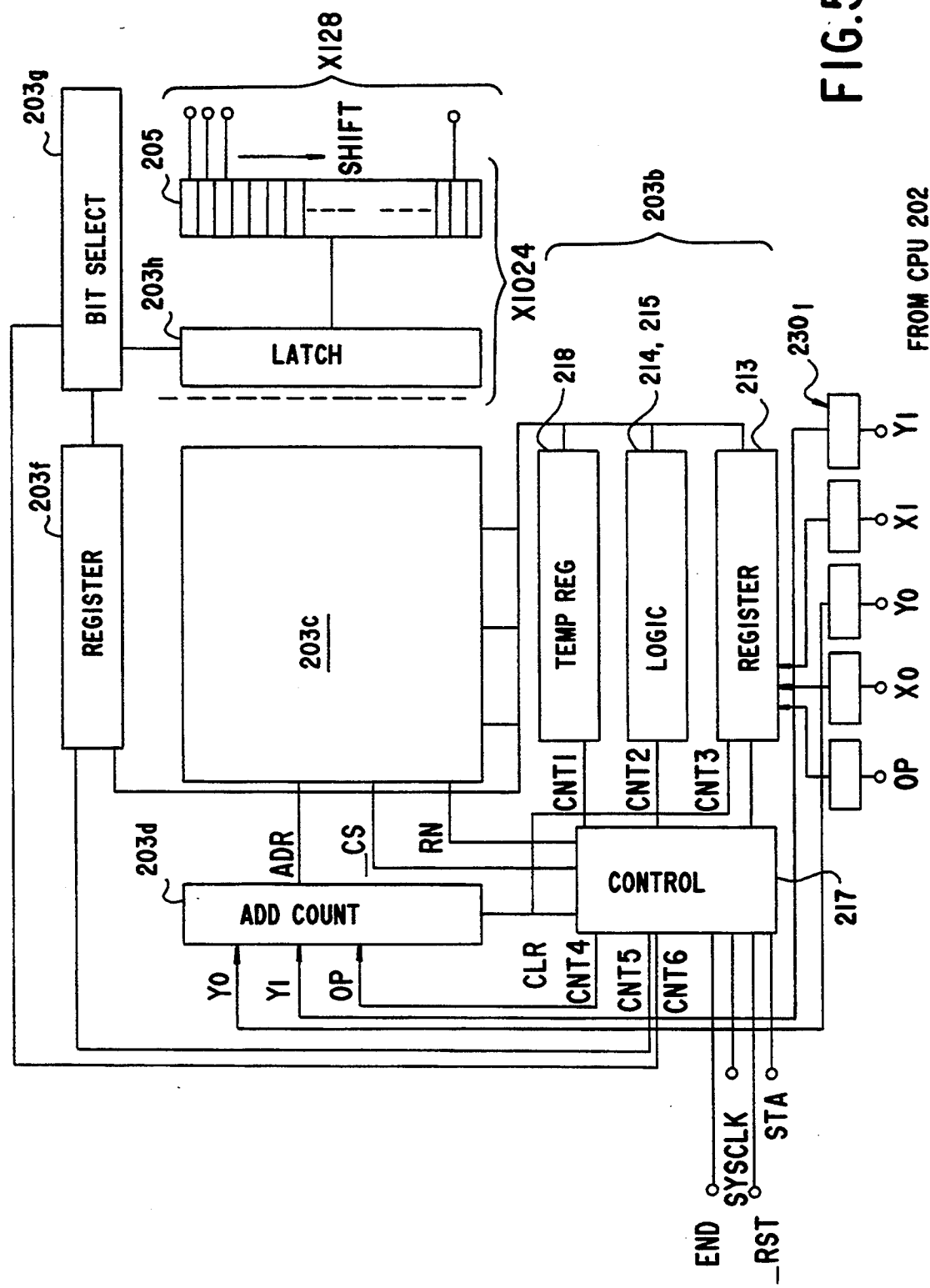
FIG. 5 is a diagram showing the construction of a control device in the electron-beam exposure system according to a first embodiment of the present invention.

Referring to FIG. 5, the illustrated circuit corresponds to the structure of FIG. 4, and the dot pattern data expanded by the data expansion circuit 203b based upon the exposure data OP, $X_0$, $Y_0$, $X_1$, and $Y_1$, is stored into the canvas memory 203c in correspondence to the Y address specified by the address counter 203d.

At the time of reading out, dot pattern data in the canvas memory 203c is read out line by line by changing the Y address sequentially by means of the address counter 203d, and the dot pattern data thus read out for one line is held in a register 203f. The dot pattern data for one line is then transferred to a bit-selection circuit 203g, and the bit-selection circuit 203g is controlled by the control circuit 217 to output the data of a specific bit that corresponds to a specific column on the BAA mask 110, to a latch circuit 203h. The latch circuits 203h correspond in number to the aperture columns on the BAA mask 110 and supply sequentially the dot pattern data for the predetermined specific column to a shift register that constitutes an output buffer circuit 205, in correspondence to the sequential selection of the Y address by the address counter 203d. Each cell in the shift register 205 corresponds to the respective aperture in the aperture columns aligned in the Y direction on the BAA mask 110 and drives sequentially the electrostatic deflectors provided on the apertures on the BAA mask 110, in response to the scanning of the electron beam in the Y direction.

It is obvious in the structure shown in FIG. 5 that, since the reading out is sequentially carried out when the data for one column is read out, it requires a long time to rearrange the data and to drive the electrostatic deflectors on the BAA mask.

FIGS. 6(A)–6(M) and FIGS. 7(A)–7(M) show the timing charts showing the timing of the exposure operation in the electron-beam exposure system of FIG. 5, wherein FIGS. 6(A)–6(M) show the operation in the expansion mode for storing the dot pattern data in the canvas memory 203c of FIG. 5. On the other hand, FIGS. 7(A)–7(M) show the operation in the reading mode for reading out the dot pattern from the canvas memory 203c.

Referring first to FIGS. 6(A)–6(M), a clock signal SYSCLK is continuously supplied to the control circuit 217 of FIG. 5 as a system clock, and the control circuit 217 is set up to an initialized state in response to an initializing signal _RST. More specifically, when the initializing signal _RST goes low, the control circuit 217 is set to the initialized state and outputs a low level reset signal CLR to cause a reset of the address counter 203d. On the other hand, when the _RST signal goes high, the control circuit 217 is released from the initialized state and enters into the bit expansion mode, wherein the circuit 217 waits for incoming of an activation signal STA.

When the activation signal STA comes in, the control circuit 217 changes the reset signal CLR to high and releases the reset of the address counter. Further, the control circuit 217 outputs simultaneously a control signal CNT4. Thereby, the dot pattern data $Y_0$ and $Y_1$ from the buffer $203_1$ are transferred to the address counter 203d. The address counter 203d in turn calculates the initial address and the final address of the line selection based upon the data $Y_0$ and $Y_1$ and selects a row address of the canvas memory 203c. Next, the control circuit 217 outputs a control signal CNT1 to the temporary register 218 and a row-selection signal _CS to the memory 203c. As the result, the temporary register 218 reads out the dot pattern data from the selected row address of the canvas memory 203c and holds the same. At the same time, the control circuit 217 outputs a control signal CNT3 to the X register 213 and causes the register 213 to read the data OP, $X_1$ and $X_2$ out from the buffer 203. Further, the control circuit 217 outputs a control signal CNT2 to the logic units 214 and 215 and stores the result of the logic operation again in the temporary register 18. As a result, the dot pattern data stored already in the canvas memory 203c is revised based upon the data OP, $X_1$ and $X_2$ that are transferred to the X register. Alternatively, the data OP, $X_1$ and $X_2$ are newly stored in the canvas memory 203c.

Further, the control circuit 217 outputs a write clock RW and the row-selection signal _CS to the memory 203c, and the content of the temporary register 218 is transferred to and is stored in the canvas memory 203c. Thereby, the dot patterns are sequentially written, line by line, in the canvas memory 203c while changing the row address of the memory 203c sequentially from the initial address to the final address.

Next, the operation of the read out mode for reading out the dot pattern in the system of FIG. 5 will be described in detail with reference to FIGS. 7(A)–7(M).

The read out mode is initiated in response to the activation signal STA provided during the high level state of the reset signal _RST. Thus, the control circuit 217 outputs a control signal CNT4 to the address counter 203d in response to the activation signal STA, and the dot pattern data $Y_0$ and $Y_1$ are transferred from the buffer $203_1$ to the address counter 203d. The address counter 203d in turn calculates the initial address and the final address of row selection based upon the data $Y_0$ and $Y_1$, and selects a row address in the memory 203c based upon the result thereof. Then, the control circuit 217 provides a control signal CNT5 to the register 203f and reads out the dot pattern data held in the memory 203c in correspondence to the selected row address. The dot pattern data thus read out is subsequently stored in the register 203f. Furthermore, the control circuit 217 provides another control signal CNT6 to the bit detection circuit 203g, and the bit detection circuit 203g selects a bit of the dot pattern data corresponding to a predetermined memory cell column and supplies the same to the latch circuit 203h. The latch circuit holds the dot pattern data of 1 bit thus supplied, and further supplies the same to the shift register 205. There, by changing the row address in the canvas memory 203c sequentially from the initial address to the final address, one-bit dot pattern data for one column is stored sequentially in the shift register 205, and the one-bit dot pattern in the register 205 drives the BAA mask 110. It is needless to say that the latch circuits 203h and the shift registers 205 cooperating with the bit-selecting circuit 203g correspond in number to the memory cell columns in the canvas memory 203c. Thus, according to the present embodiment, it becomes possible to read out one-bit dot patterns line by line from the canvas memory 203c and rearrange the same in the column direction.

In the electron-beam exposure system described in the embodiment of FIG. 5, it is necessary to read out all lines in the canvas memory 203c to get the dot pattern data for one column, and such a read out operation is carried out in sequence, thus taking time. Therefore, in a high-speed electron-beam exposure system which operates at a clock rate of not less than 400 MHz, the read out of the dot pattern from the memory 203c may become a bottleneck of the exposure operation speed.

Figure 1:
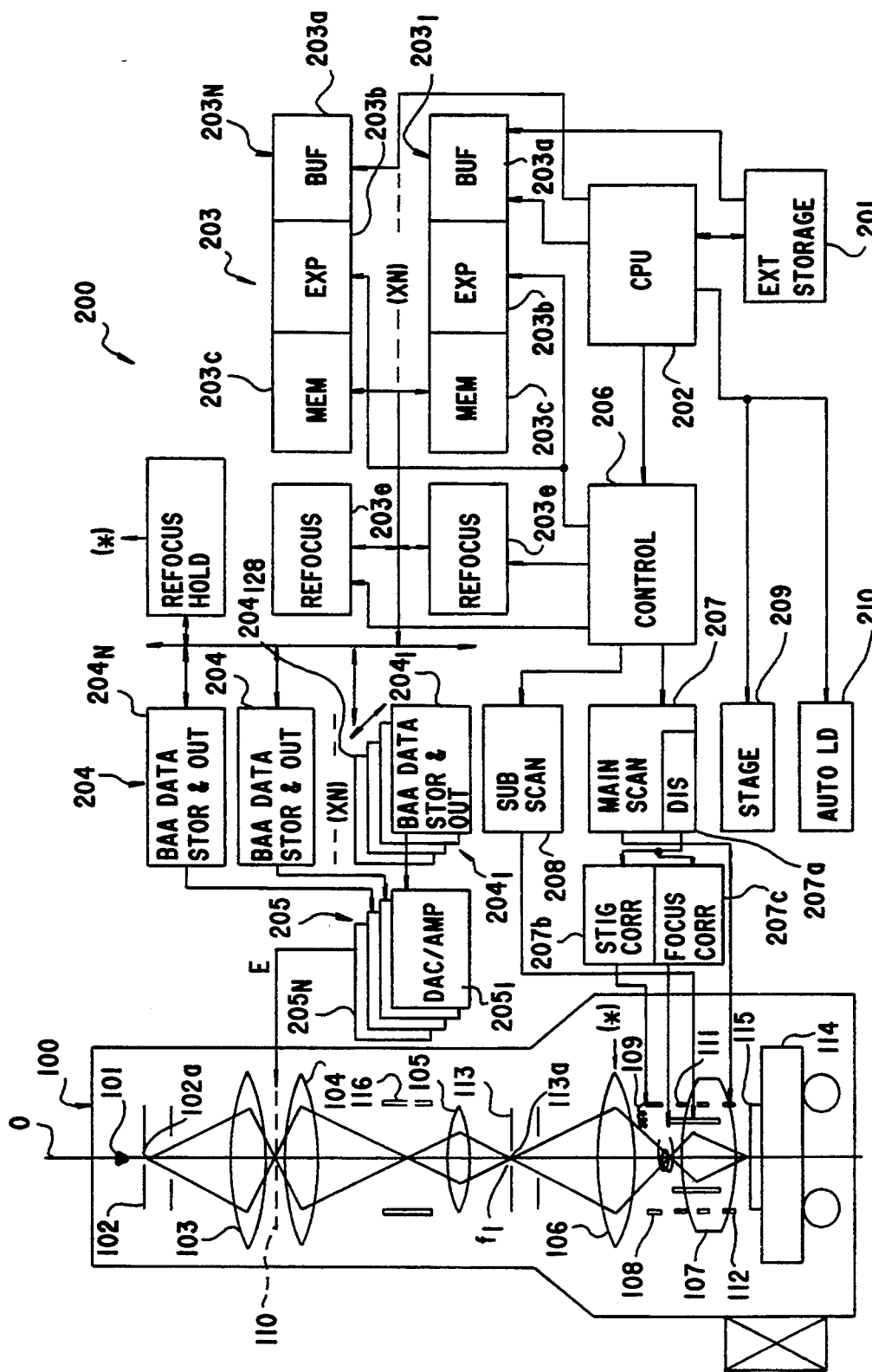
FIG. 1 is a diagram showing the overall construction of a conventional electron-beam exposure system.
Figure 2:
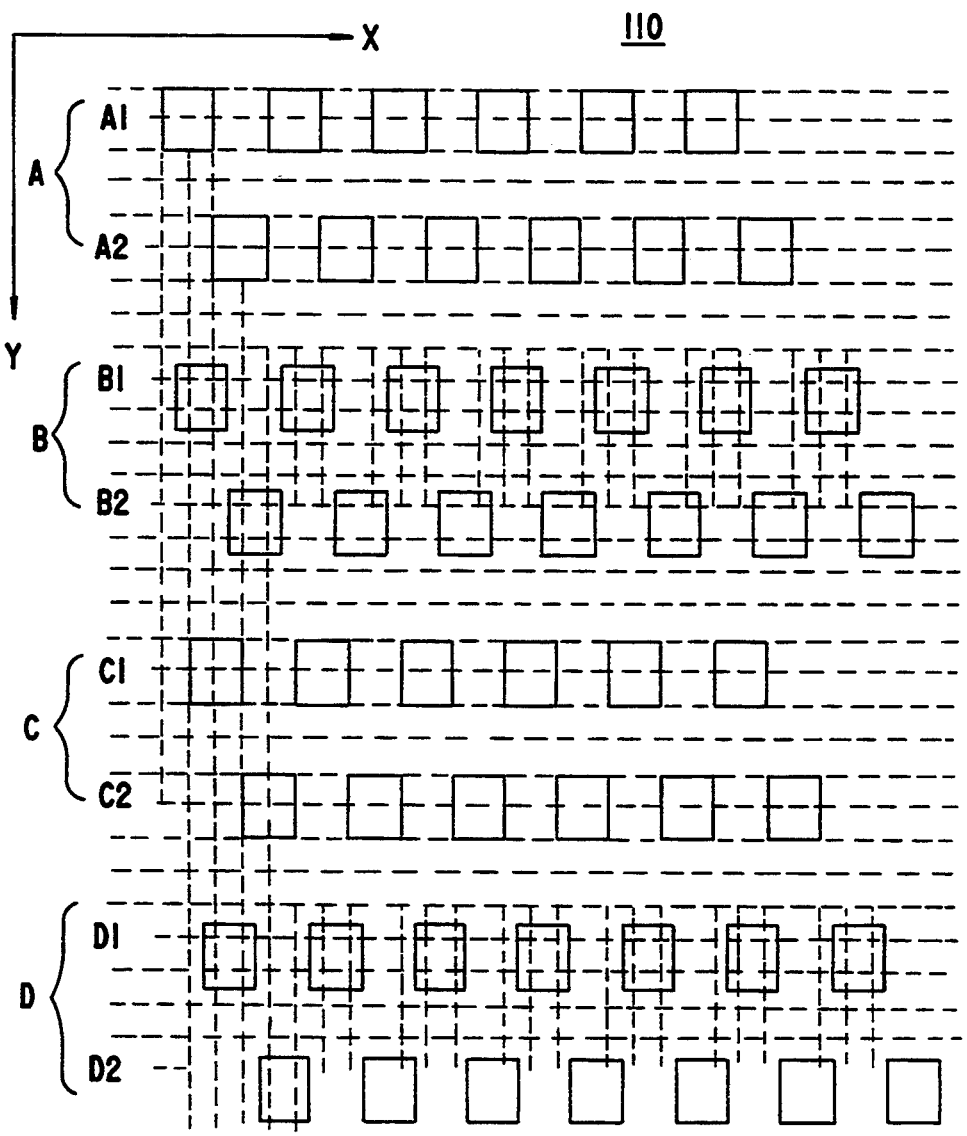
FIG. 2 is a diagram showing the construction of a BAA mask used in the electron-beam exposure system of FIG. 1.
Figure 3:
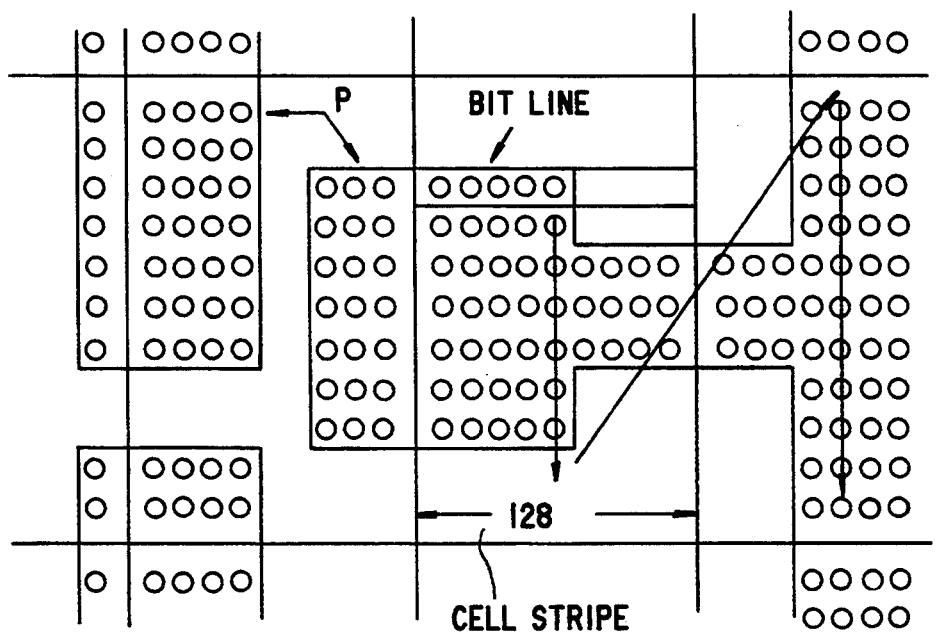
FIG. 3 is a diagram showing an example of the exposure dot pattern exposed by the BAA mask of FIG. 2.
Figure 8B:
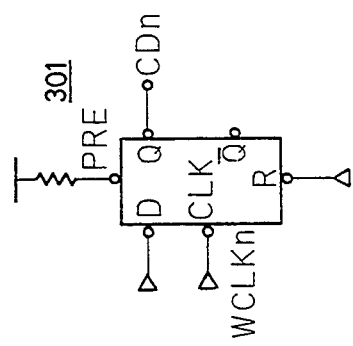
FIGS. 8(A)–8(C) are circuit diagrams showing the construction of a canvas memory of the electron-beam exposure system according to a second embodiment of the present invention.
Figure 8C:
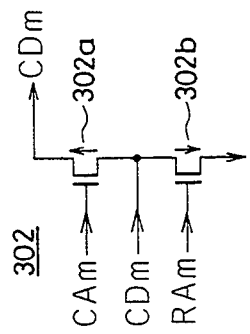
Figure 8A:
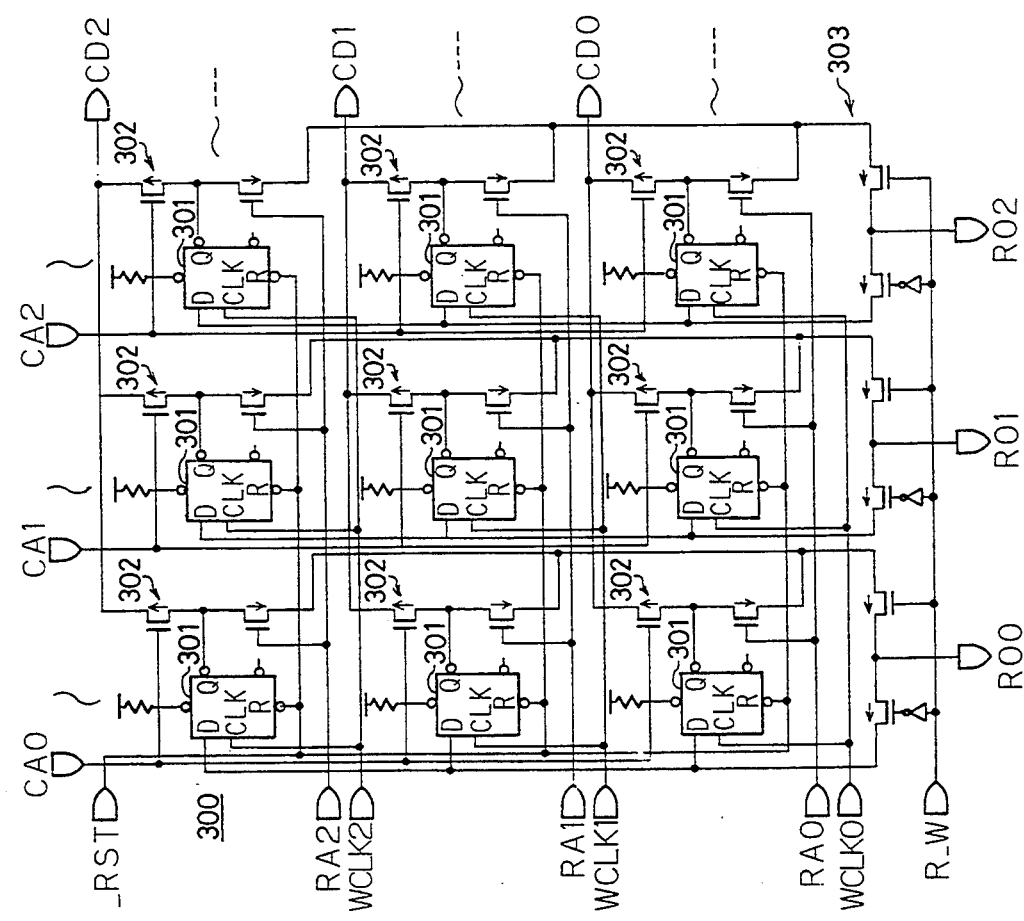

The structure of the data expansion circuit of the electron-beam exposure system that solves the above problem will now be described in detail according to a second embodiment of the present invention, with reference to FIGS. 8(A)–8(C), wherein FIG. 8(A) shows the overall construction of a canvas memory formed of a latch array 300, which replaces the conventional canvas memory 203c of FIG. 1 that is constructed in SRAM or other semiconductor memory devices. FIG. 8(B), on the other hand, shows an individual latch element 301 constituting a latch array 300 of FIG. 8(A). Further, FIG. 8(C) shows the structure of an output gate circuit cooperating with the latch element 301 of FIG. 8(B).

Referring to FIG. 8(B) first, each of the latch elements 301 includes a power terminal PRE which is supplied with a power voltage, a data input terminal D which is supplied with one bit input data, a clock terminal CLK which is supplied with a write clock WCLKn, a data output terminal Q which outputs data held in the latch element, and a reset terminal R supplied with a reset pulse _RST, wherein the latch element 301 holds the data supplied to the data input terminal D in response to the clock pulse supplied to the clock terminal CLK. The latch element 301 outputs the data thus held therein at the data output terminal Q, and is cleared in response to the reset pulse CLR which is supplied to the reset terminal R.

In the canvas memory of FIG. 8(A), the latch element 301 of FIG. 8(B) is arranged in rows and columns to form the above latch array 300. The row direction in the latch array 300 corresponds to the row direction of the apertures on said BAA mask 110 extending in the X direction, while the column direction in the latch array 300 corresponds to the column direction of the apertures on said BAA mask 110 extending in the Y direction. Accordingly, in the case wherein 128 apertures are arranged in the X direction and 1024 apertures in the Y direction on the BAA mask 110, the latch elements 301 are also arranged in rows of 128 and columns of 1024.

In the latch array 300, the latch elements 301 are supplied commonly with a reset pulse _RST at the respective reset terminals R and experience a simultaneous resetting in response to the reset pulse _RST. In response to the resetting, therefore, all the dot pattern data held in the array 300 are erased simultaneously. Furthermore, those latch elements 301 aligned in the column direction in the array 300 have respective data input terminals D connected together and are supplied simultaneously with one-bit data constituting the dot pattern data for one line from the output register 218 in the data expansion circuit 203b (see FIG. 4) via respective read/write gates 302, which read/write gates 302 are turned on and off in response to a read/write clock R_W. For example, in FIG. 8(A), one-bit dot pattern data $RO_0$ is supplied commonly to the data input terminals D of the latch elements 301 that constitute the leftmost column of the array 300 via the corresponding gates 302. Similarly, one-bit dot pattern data $RO_1$ is supplied commonly to the data input terminals D of the latch elements 301 constituting a middle column of the array 300, and one-bit dot pattern data $RO_2$ is supplied commonly to the data input terminals D of each latch elements 301 constituting the rightmost column of the array 300.

On the other hand, in the latch array 300, those latch elements 301 aligned in the row direction have respective clock input terminals CLK connected together, and clock signals $WCLK_0$–$WCLK_2$ are supplied simultaneously to the latch elements aligned in the row direction. For example, a clock signal $WCLK_0$ is supplied commonly to the clock input terminals CLK of the latch elements 301 constituting the lowermost row of the array 300, a clock signal $WCLK_1$ is supplied commonly to the clock input terminals CLK of the latch elements 301 constituting the middle row of the array 300, and a clock signal $WCLK_2$ is supplied commonly to the clock input terminals CLK of latch elements 301 constituting the uppermost row of the array 300. Thus, by supplying a clock signal simultaneously to the latch elements forming a selected row in the array 300 based upon the data $Y_0$ and $Y_1$ that specifies the row of the apertures on the BAA mask 110, it becomes possible to write the dot pattern data for one row simultaneously into the latch elements 301 that constitute a selected row in the array 300. In other words, by using the latch array 300 having the structure of FIG. 8(A) as a canvas memory, it becomes possible to write the dot pattern data produced by the data expansion circuit 203b line by line into the latch elements 301 that form the canvas memory, similarly to the canvas memory 203c that uses conventional memory devices.

In the structure of FIG. 8(A), it will be noted that the read-out gate 302 is provided for gating the output data CDn obtained at the output terminal Q, wherein the read-out gate 302 has a structure shown in FIG. 8(C). Thus, the read out gate 302 is composed of an N channel MOS transistor 302a and a P channel MOS transistor 302b connected in series, wherein the output data CDn of the latch element 301 is supplied to the intermediate node connecting the transistor 302a and the transistor 302b. As a result, by turning on the transistor 302a by a control signal CAn, it becomes possible to output the one-bit dot pattern data held in the latch element 301 to the driving circuit 204 (see FIG. 5) that drives the BAA mask 110. Furthermore, by turning on the transistor 302b by another control signal RAn, it becomes possible to feed back the same one-bit dot pattern data to the data expansion circuit 203b via another read out gate 303. The data expansion circuit 203b thereby revises the pattern data thus fed back from the canvas memory 300 based upon the OP data expressing the shape of the exposure pattern and stores the same again into the memory 300.

In the structure of FIG. 8(A), the read out gates 302 cooperating with the latch elements 301 that are aligned to form a column are connected so that the control signal CAn is commonly supplied thereto. For example, in the latch elements 301 constituting the leftmost column in FIG. 8(A), a control signal $CA_0$ is supplied commonly to the gates of the transistors 302a that constitute the cooperating gates 302 to turn them on. As a result, the data held by the latch elements 301 forming the leftmost column are simultaneously supplied to the respective output lines $CD_0$ to $CD_2$. Similarly, a control signal $CA_1$ turns on the gates 302 cooperating with the latch elements 301 aligned to constitute the middle column of the array 300. As a result, one-bit pattern data held in the latch elements 301 at the middle column are simultaneously supplied to the respective output lines $CD_0$ to $CD_2$. Furthermore, the control signal $CA_2$ turns on the gates 302 cooperating with the latch elements 301 aligned to constitute the rightmost column of the array 300. As a result, one-bit pattern data held in the latch elements 301 at the rightmost column are simultaneously supplied to the respective output line $CD_0$ to $CD_2$. By supplying the control signals $CA_1$ to $CA_n$ as a column-selection signal, therefore, the one-bit dot pattern data held in the latch element constituting the selected column can be read out simultaneously column by column.

Figure 9:
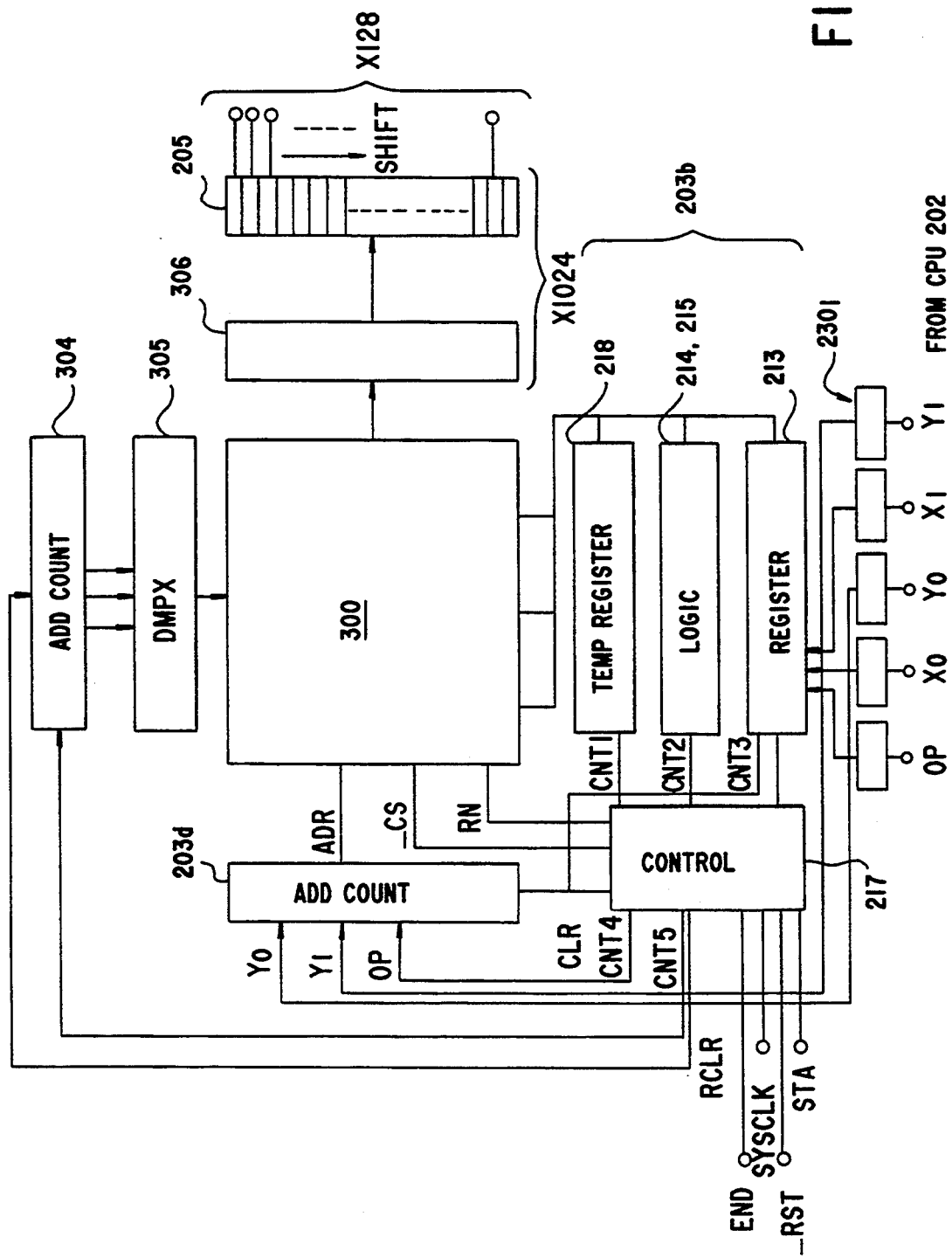
FIG. 9 is a diagram showing the construction of the control system of the electron-beam exposure system that uses the canvas memory of FIGS. 8(A)–8(C).
Figure 10:
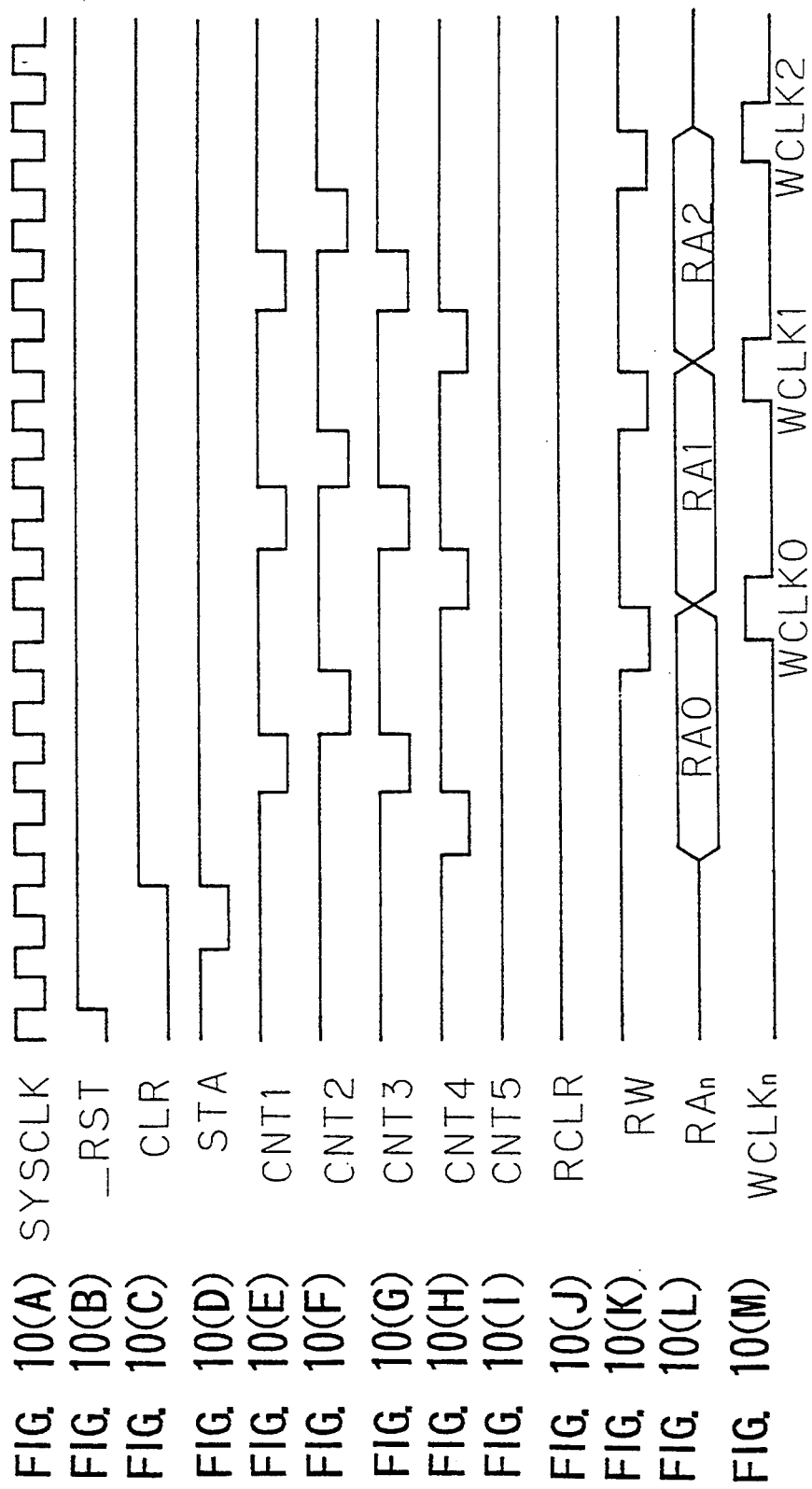
FIGS. 10(A)–10(M) are diagrams showing the operation of the system of FIG. 9 in a first mode.
Figure 11:
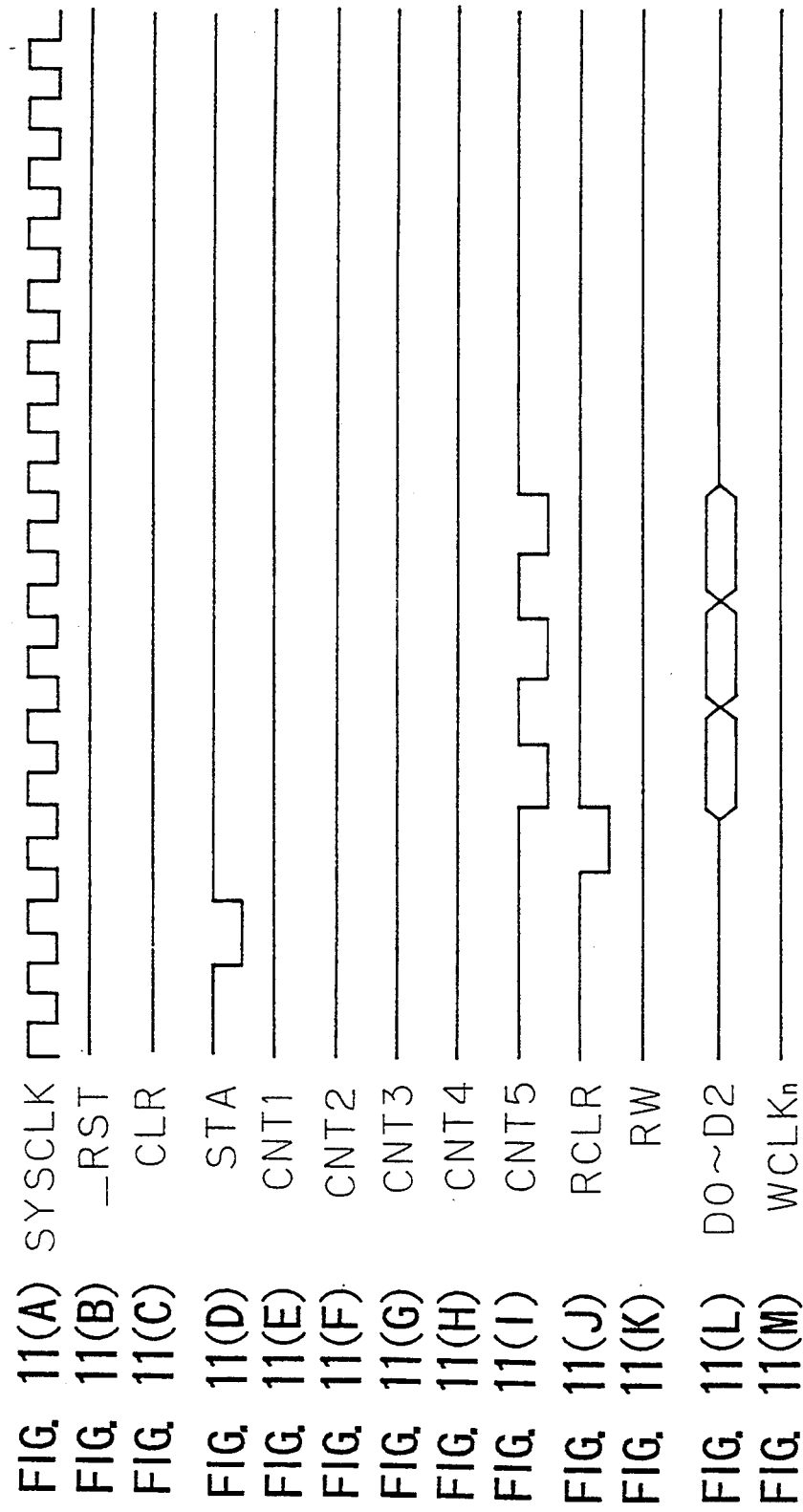
FIGS. 11(A)–11(M) are diagrams showing the operation of the system of FIG. 9 in a second mode.

FIG. 9 shows an overall construction of the data expansion circuit of the electron-beam exposure system using a canvas memory 300 shown in FIG. 8(A). The structure of FIG. 9 is similar to that of FIG. 5, and the parts previously explained with reference to FIG. 5 are given the same reference numerals and the explanation thereof is omitted.

Referring to FIG. 9, the second address counter 304 is provided to designate the address in the column direction, wherein the address counter 304 selects a column in the canvas memory 300 by outputting the column-selection signal CAn via a demultiplexer 305. By selecting a column in the canvas memory 300, the dot pattern data for one line is read out therefrom and is supplied to the shift register 205 after being held in a latch circuit 306.

FIGS. 10(A)–10(M) are timing charts showing the operation of the system of FIG. 9 in the bit expansion mode. The operation of the bit expansion mode in the present embodiment is substantially identical with that of the device of FIG. 5, therefore, the timing charts of FIGS. 10(A)–10(F) are substantially identical with those of FIG. 5.

On the other hand, FIGS. 11(A)–11(M) show the timing charts of the operation of the system of FIG. 9 in the read out mode.

Referring to FIGS. 11(A)–11(M), the read out mode is initiated by the activation signal STA being provided during the high level interval of the reset pulse _RST, and the control circuit 217 supplies a clear pulse RCLR to the address counter 303 according to the activation signal STA to cause a reset of the address counter 303. Further, in response to the control signal CNT5 supplied from the control circuit 17, the address counter 304 selects a column in the canvas memory 300 via the demultiplexer 305, and the dot pattern data corresponding to the selected column is supplied to the latch circuit 306. As seen from FIGS. 11(A)–11(M), since the dot pattern for one column is read out simultaneously in response to a single control signal CNT5, the read out operation can be achieved at a very high speed in the system of FIG. 9.

Figure 12:
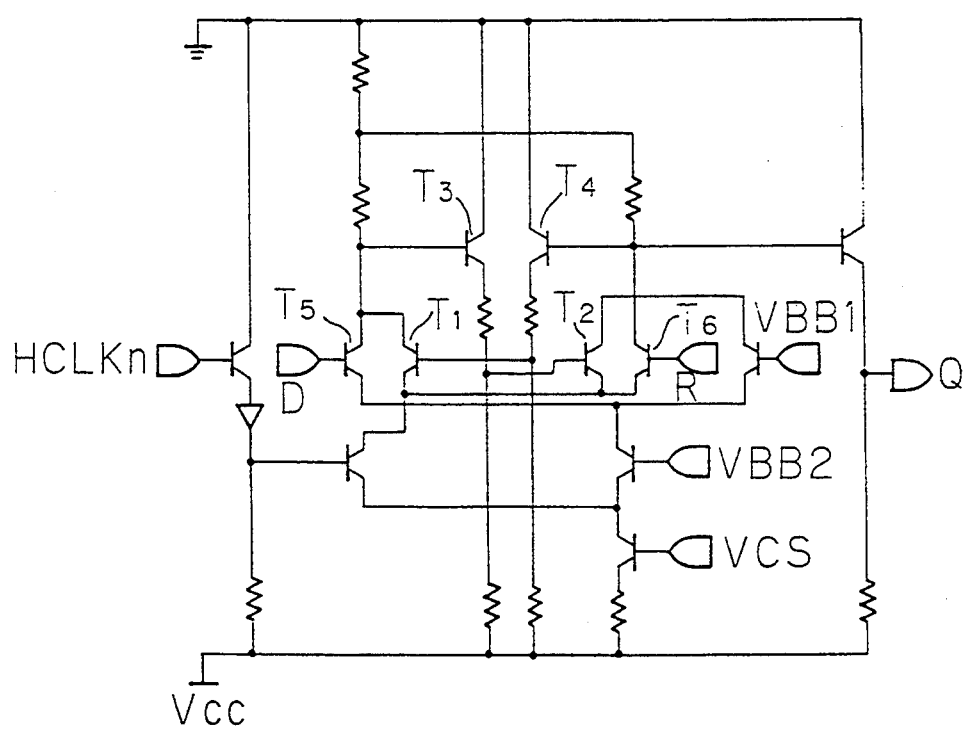
FIG. 12 is a circuit diagram showing the construction of the latch element shown in FIG. 8(B)

FIG. 12 is a circuit diagram showing one example of the construction of the latch element 301 shown in FIG. 8(B).

Referring to FIG. 12, the latch element 301 has a structure of an ECL gate, and includes bipolar transistors $T_1$ to $T_4$ which constitute a flip-flop. The data held by the flip-flop is written via a transistor $T_5$, and erased via a transistor $T_6$. Furthermore, the writing to the flip-flop is controlled by a clock signal WCLKn. As the structure of FIG. 12 is well known, further explanation thereof is omitted.

Figure 13:
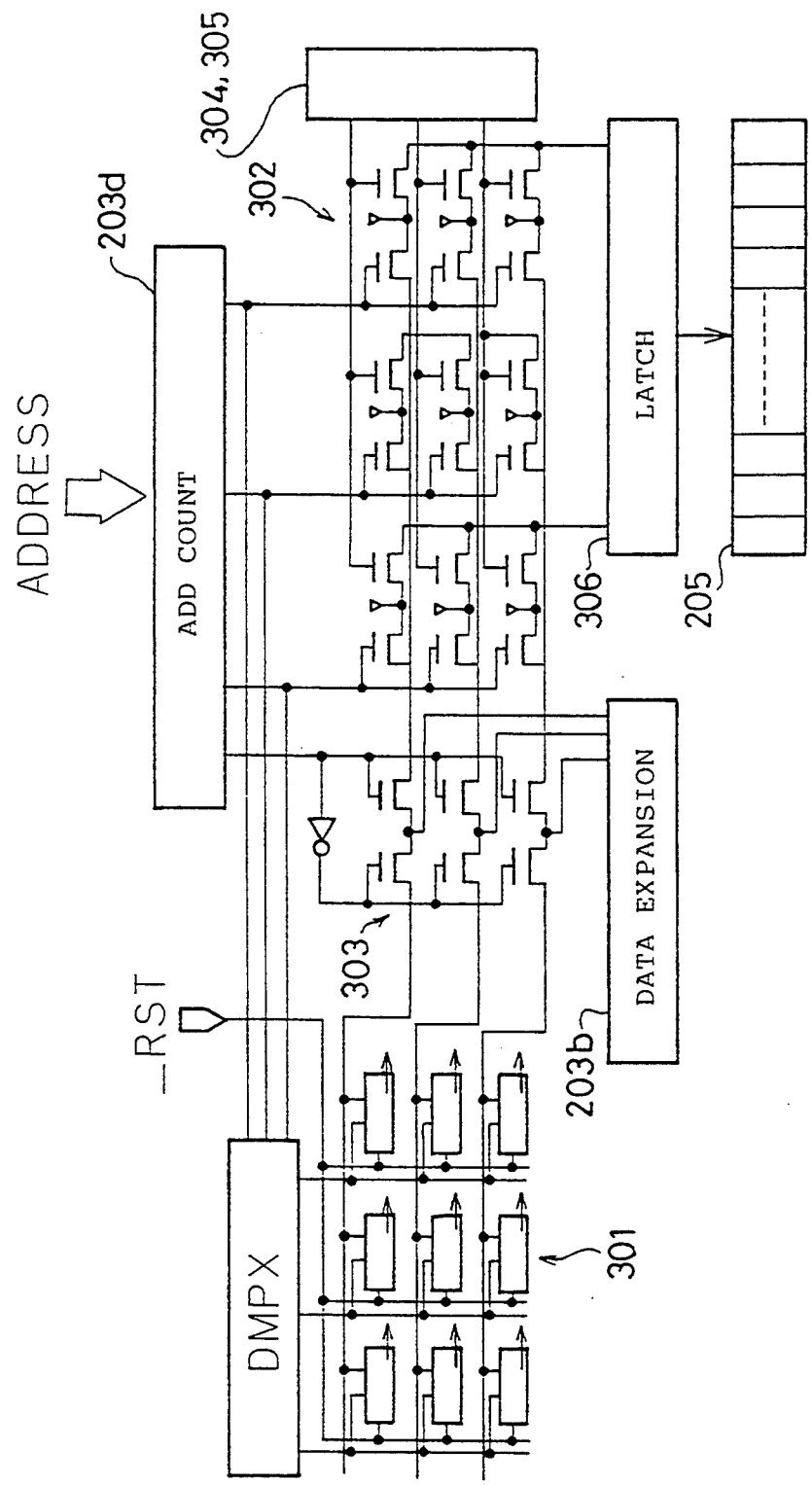
FIG. 13 is a diagram showing a third embodiment of the present invention.

FIG. 13 shows one example of the layout of the canvas memory 300 shown in FIG. 8(A).

Referring to FIG. 13, in the present embodiment, the read out gate 302 and the latch element 301 form different arrays, i.e., the array of the latch elements 301 is driven line by line by the address counter 203d and the demultiplexer cooperating therewith. On the other hand, the array of the read out gates 302 is driven column by column by the address counter 203d and the demultiplexer 305 cooperating therewith. Furthermore, another read out circuit 303 is provided between the array of the latch elements 301 and the array of the read out gates 302 to read out the dot pattern data for one line stored in the arrangement of the latch element 301 for feeding the same back to the data expansion circuit 203b.

According to the structure of the present embodiment, the layout of the circuit becomes simple by constituting the array of the latch elements 301 and the array of the read out gates 302 separately.

Although the present invention has been described in detail heretofore with reference to preferred embodiments, the present invention is by no means limited to these embodiments but various variations and modifications may be made without departing from the scope of the invention.

What is claimed is:

1. An electron-beam exposure system comprising:
   an electron beam source for producing and emitting an electron beam along a predetermined optical axis toward an object to be exposed;
   focusing means for focusing said electron beam on said object to be exposed;
   deflection means for deflecting said electron beam with respect to said optical axis for causing said electron beam to scan over said object to be exposed;
   a blanking aperture array mask for forming a plurality of electron beam elements corresponding to individual exposure dots that constitute an exposure pattern, said blanking aperture array mask being provided on said optical axis between said electron beam source and said object to be exposed and carrying thereon a plurality of apertures arranged in rows and columns, said plurality of apertures forming said plurality of electron beam elements by shaping said electron beam;
   driving means provided in correspondence to each of said plurality of apertures on said blanking aperture mask, said driving means being supplied with a driving signal for turning on and turning off the electron beam passing through said aperture in response to said driving signal;
   data expansion means supplied with exposure data corresponding to said exposure pattern for generating dot pattern data representing the exposure dots to be exposed on said object based upon said exposure data;
   pattern memory means for storing dot pattern data generated by said data expansion means;
   write/read control means for writing said dot pattern data generated by said data expansion means into said pattern memory means and reading said dot pattern data from said pattern memory means; and
   exposure control means for controlling an exposure operation;
   said pattern memory means comprising:
   a plurality of latch elements formed in rows and columns in correspondence to said plurality of apertures formed in rows and columns on said blanking aperture array mask; and
   output gate means provided in correspondence to each column of said plurality of latch elements;
   each of said latch elements that form a row being supplied with one-bit data which constitutes dot pattern data for one line from said data expansion means, each of said latch elements that form a row being further supplied with a common line-selection signal and holding one-bit data supplied from said data expansion means in response to said line-selection signal;
   said output gate means being supplied with a column selection signal for selecting a column, said output gate means outputting said dot patterns held in each of said latch elements simultaneously for each of said columns;
   said write/read control means being controlled by said exposure control means for producing said line-selection signal and said column-selection signal.

2. An electron-beam exposure system according to claim 1, wherein each of said latch elements that constitute said pattern memory means includes a first input terminal supplied with one-bit data that constitutes said dot pattern data, a second input terminal supplied with a write clock, and an output terminal for outputting data held therein; each of said latch elements aligned in the direction of said columns having, in each of said columns, said first input terminal connected commonly to an input line corresponding to said column, said input lines being supplied, in each of said columns, with corresponding bits of said one-bit data that constitute said dot pattern data from said data expansion means simultaneously; each of said latch elements aligned in the direction of said rows having, in each of said rows, said second input terminals connected commonly to a row control line corresponding to said row, said row control line being supplied, in each of said rows, with a write control signal selectively from said exposure control means, each of said latch elements that constitute said pattern memory means holding said one-bit data supplied to said first input terminal in response to said write control signal.

3. An electron-beam exposure system according to claim 2, wherein said data expansion means provides sequentially and selectively said write control signal to said row control line.

4. An electron-beam exposure system according to claim 2, wherein said output gate means comprises output transistors provided in correspondence to each of said latch elements that constitute said pattern memory means, each of said output transistors being connected to said output terminal of the corresponding latch element, said output transistors for those of said latch elements that are aligned in the direction of said columns are connected, in each of said columns, to a corresponding common column-control line, said column-control line being supplied with a read out control signal selectively from said exposure control means, wherein said output transistors are turned on in response to said read out control signal.

5. An electron-beam exposure system according to claim 4, wherein said output transistors provided in correspondence to said latch elements aligned in the direction of said rows, are connected, in each of said rows, to a common output line corresponding to said row, and each of said latch elements that constitutes said pattern memory means outputs the data held therein from said output terminal in response to the read out control signal supplied to said second input terminal.

6. An electron-beam exposure system according to claim 4, wherein said latch elements that constitute said pattern memory means are arranged in rows and columns to constitute a first array, and wherein said output transistors corresponding to said latch elements are arranged in rows and columns to constitute a second, different array.

7. An electron-beam exposure system according to claim 1, wherein each of said latch elements that constitute said pattern memory means has a reset terminal connected to a common reset line and supplied with a reset signal, and wherein said exposure control means supplies a reset signal simultaneously to said reset line to cause a resetting of said latch elements substantially simultaneously.

8. An electron-beam exposure system according to claim 1 further comprising second output gate means provided in correspondence to each of said columns of latch elements that constitute said pattern memory, said second output gate means being selected per each row of said latch elements to feed back the one-bit dot pattern data held in said selected latch elements to said data expansion means.

9. An electron-beam exposure system, comprising:
an electron beam source for producing and emitting an electron beam along a predetermined optical axis toward an object to be exposed;
focusing means for focusing said electron beam on said object to be exposed;
deflection means for deflecting said electron beam with respect to said optical axis for causing said electron beam to scan over said object to be exposed;
a blanking aperture array mask for forming a plurality of electron beam elements corresponding to individual exposure dots that constitute an exposure pattern, said blanking aperture array mask being provided on said optical axis between said electron beam source and said object to be exposed and carrying thereon a plurality of apertures arranged in rows and columns, said plurality of apertures forming said plurality of electron beam elements by shaping said electron beam;
driving means provided in correspondence to each of said plurality of apertures on said blanking aperture mask, said driving means being supplied with a driving signal for switching on and switching off the electron beam passing through said aperture in response to said driving signal;
data expansion means supplied with exposure data corresponding to said exposure pattern for generating dot pattern data representing the exposure dots to be exposed on said object based upon said exposure data;
pattern memory means for storing dot pattern data generated by said data expansion means;
write/read control means for writing said dot pattern data generated by said data expansion means into said pattern memory means and reading said dot pattern data from said pattern memory means; and
exposure control means for controlling an exposure operation;
said pattern memory means comprising a plurality of memory cells arranged in rows and columns;
said write/read control means comprising:
a write/read section for writing dot pattern data line by line in sequence and further for reading out dot pattern data line by line in sequence;
a register section for storing said dot pattern data corresponding to one line and read out by said write/read section in the form of multiple bit data;
bit-selection means for selecting a bit from said multiple bit data stored in said register section; and
a shift register including a plurality of cells, said shift register being supplied with the bits selected by said bit selection means in sequence in response to a reading out from said memory cell array, for storing said bits consecutively in said plurality of cells, said shift register driving each of said apertures for one column formed on said BAA mask according to an output signal from said plurality of cells.

10. A method for exposing a pattern on an object by a charged particle beam, comprising the steps of:
expanding pattern data that represents said pattern to be exposed into bitmap data, said bitmap data comprising a plurality of bits, said bits corresponding to exposure dots to be exposed on said object in rows and columns;
storing said bitmap data in a memory one row at a time by selecting a row address of said memory, said row addresses of said memory corresponding to said rows of said exposure dots;
reading out said bitmap data from said memory one column at a time by selecting a column address of said memory to form column bit data in which a plurality of bits are aligned in correspondence to said column of said exposure dots; and
activating a blanking aperture array, which includes a plurality of apertures arranged in rows and columns, with said column bit data, such that those apertures aligned in a column on said blanking aperture array are selectively turned on and turned off in response to said column bit data, said apertures passing a charged particle beam therethrough when turned on and interrupting said charged particle beam when turned off.

* * * * *